US007259046B2

(12) United States Patent
Aoki et al.

(10) Patent No.: US 7,259,046 B2

(45) Date of Patent: Aug. 21, 2007

(54) SEMICONDUCTOR DEVICE AND MANUFACTURING METHOD THEREOF

(75) Inventors: Hideo Aoki, Yokohama (JP); Yoshiaki Sugizaki, Oita (JP); Naoko Yamaguchi, Yokohama (JP); Chiaki Takubo, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 11/075,421

(22) Filed: Mar. 9, 2005

(65) Prior Publication Data

US 2005/0199989 A1 Sep. 15, 2005

(30) Foreign Application Priority Data

Mar. 10, 2004 (JP) ........................... P2004-066857

(51) Int. Cl.
*H01L 21/00* (2006.01)

(52) U.S. Cl. ............................... 438/149; 257/E21.114

(58) Field of Classification Search .................... 438/5, 438/7, 10–11, 14, 16–18, 22–24, 29, 31, 34–36, 438/128–130, 149, 484, 538
See application file for complete search history.

(56) References Cited

U.S. PATENT DOCUMENTS 6,303,407 B1 10/2001 Hotchkiss et al.
2003/0045016 A1* 3/2003 Saito et al. ................... 438/29
2004/0009303 A1* 1/2004 Ito et al. ..................... 427/421
2004/0087068 A1* 5/2004 Yudasaka .................... 438/149
2004/0106232 A1* 6/2004 Sakuyama et al. .......... 438/108
2004/0124418 A1* 7/2004 Yamazaki et al. ............ 257/72
2004/0135830 A1* 7/2004 Kamiyama et al. ............ 347/9
2005/0029591 A1* 2/2005 Yudasaka et al. ........... 257/347
2005/0170076 A1* 8/2005 Seki et al. .................... 427/66
2006/0006405 A1* 1/2006 Mazzochette ................ 257/99

FOREIGN PATENT DOCUMENTS

JP 7-114218 5/1995
JP 7-211721 8/1995
JP 3283977 3/2002

OTHER PUBLICATIONS

JEDEC Publication 95, Design Guide 4.5: "Fine-pitch, Square Ball Grid Array Package (FBGA)", dated Jan. 2003.

* cited by examiner

*Primary Examiner*—Michael Lebentritt
*Assistant Examiner*—Andre' Stevenson
(74) *Attorney, Agent, or Firm*—Finnegan, Henderson, Farabow, Garrett & Dunner, L.L.P.

(57) ABSTRACT

According to one aspect of the present invention, a semiconductor device, comprising a wiring board provided with wires and electrodes; a semiconductor element which is mounted on the wiring board and has plural connection electrodes formed on its surface; and a metal layer of fine metal particles aggregated and bonded which is interposed between the electrodes on the wiring board and the connection electrodes of the semiconductor element to connect between the electrodes and the connection electrodes, is provided.

3 Claims, 7 Drawing Sheets

21
28
20
27
26
22
23

SEMICONDUCTOR DEVICE AND MANUFACTURING METHOD THEREOF

CROSS-REFERENCE TO THE INVENTION

This application is based upon and claims the benefit of priority from the prior Japanese Patent Application No. 2004-66857, filed on Mar. 10, 2004; the entire contents of which are incorporated herein by reference.

BACKGROUND OF THE INVENTION

1. Field of the Invention

The present invention relates to a semiconductor device and a method of connecting the semiconductor device, and more particularly to a connecting method for mounting a semiconductor device on a wiring board which configures a system, a connecting method for mounting semiconductor elements (hereinafter referred to as the semiconductor chips), which also configure the semiconductor device, on the wiring board configuring the semiconductor device, and a connecting method for semiconductor chips which configure the semiconductor device.

2. Description of the Related Art

A semiconductor device is configured by mounting one or plural semiconductor elements on a mounting substrate such as a wiring board. In recent years, flip-chip mounting is employed to bond connection electrodes such as projecting electrodes (also called as bumps) formed on the surface of a semiconductor chip, to wires or electrodes formed on a wiring board, thereby mounting the semiconductor elements on the mounting substrate. It is a general method that the solder bumps of the semiconductor chip are aligned with the electrodes of the wiring board and heated to melt so as to bond and fix the solder bumps with the electrodes. The bumps on the semiconductor chip are configured by forming openings in an insulating film which is coated to protect the electrode pads of Al or Cu of the semiconductor chip, forming a barrier metal such as Ti/Ni, Ti/Ni/Pd, Cr/Cu or the like thereon, and further forming bumps of Sn/Pb solder or the like thereon. The semiconductor device having such a flip-chip mounting structure may protect a gap between the semiconductor chip and the wiring board by an underfill resin or protect the wiring board and the semiconductor chip as a whole by coating a mold resin or the like.

FIG. 11A and FIG. 11B show examples of a prior art method of connecting a semiconductor chip to a wiring board. FIG. 11A shows a conventional semiconductor device which has the semiconductor chip flip-chip mounted on the wiring board. A protective insulating film 108 such as a silicon oxide film is applied onto the main surface of a semiconductor substrate 101. On the main surface on which the protective insulating film 108 is formed, electrode pads 104 of Al or the like which are electrically connected to an inside integrated circuit, barrier metal layers 105 which are on the electrode pads 104 and extend to reach the protective insulating film 108 over the electrode pads 104, and bumps 103 formed of solder mainly consisting of Pb, Sn and the like and formed on the barrier metal layers 105 are formed (FIG. 11A). Meanwhile, a wiring board 102 on which the semiconductor substrate 101 is mounted has wiring patterns of Cu or the like and electrode pads 106 partly forming the wiring patterns on its main surface. Barrier metal layers 107 of Ni/Au, Pb—Sn or the like are formed on the electrode pads 106. The plural bumps 103 on the semiconductor substrate 101 are electrically connected to the electrode pads 106 which are formed on the surface of the wiring board

102, and the semiconductor substrate 101 is mounted on the wiring board 102. For the bumps 103, gold may be used other than the solder. As the solder material, Pb—Sn, Sn—Ag, Sn—Ag—Cu or the like is generally used. For the mounting substrate 102, a glass epoxy substrate, a ceramic substrate, a flexible substrate or the like is used.

A conventional method of producing a semiconductor device using conductive particles for the connection structure is described in, for example, Japanese Patent Laid-Open Application No. HEI 7-211721. The formation of bumps by blowing fine metal particles is described in, for example, Japanese Patent No. 3283977. A method of blowing fine metal particles onto connections is described in, for example, Japanese Patent Publication No. HEI 7-114218.

A production of a semiconductor device which has semiconductor chips mounted on a wiring board has a problem of thermal stress at the connecting time. For example, when a glass epoxy substrate is used for the wiring board, Si as a material for the semiconductor chip and the glass epoxy substrate as the wiring board have a large difference in a thermal expansion coefficient, so that solder bumps interposed between them are exposed to stresses from both of them when they are cooled from the temperature at the connecting time to room temperature, and the bumps and an insulating film below them have a possibility of breakage (see FIG. 11C). This problem becomes obvious when the bumps themselves become to be hardened by omitting Pb from Pb—Sn solder for the protection of environment, when a pitch of the bumps becomes microscopic, or when a fragile material such as a low dielectric constant film is used for the insulating layer of the semiconductor element. Therefore, the temperature at the time of connection is desired to be 100° C. or below at which a stress is small.

As a connection method at a low temperature, the prior art methods proposed and developed include a method using a low-melting metal, a method using an anisotropic conductive film (ACF), a method connecting in a high vacuum and the like. But, where a material for the low-melting metal is selected to lower the melting point to 100° C. or below, the cost of the metal itself increases, and oxidation causes degradation in reliability of connection, difficulty in processing and the like, so that the application of such a metal to general parts is hard to realize. The connection method using the ACF holds a resin film containing conductive particles between the electrode surface of the semiconductor chip and the wiring pattern surface of the wiring board, heats and pressurizes them to effect the electrical connection. This method has problems that the device, chips, bumps and the like are highly required to be even, bringing about a cost rise and a mechanical damage to the semiconductor element when pressurized. The connection in a high vacuum causes technical and cost problems such as surface cleanliness, necessity of high-vacuum equipment and the like in addition to the problem of the evenness.

Regardless of which method is used, if a semiconductor chip once connected to the wiring board by the burn-in or the test thereafter is defective, it is hard to remove the defective semiconductor chip and to mount another semiconductor chip in the same position. Therefore, burn-in or test thereafter is generally performed after mounting all the semiconductor chips, in the case of the semiconductor device on which plural semiconductor chips are mounted. If it is found that the semiconductor device has a defective semiconductor chip, it is necessary to change the defective part to another semiconductor chip. But, the prior art connection method is hard to exchange the semiconductor chips after connecting, so that the occurrence of a defective product results in disposal of the wiring board and the semiconductor chips together. Therefore, where plural semiconductor chips are mounted on the wiring board, the mounted other semiconductor chips which are good-quality products and the wiring board must be abandoned as a whole if there is a single defective part, and there was a considerable economic influence.

BRIEF SUMMARY OF THE INVENTION

A semiconductor device according to an embodiment of the present invention comprises a wiring board provided with wires and electrodes; a semiconductor element which is mounted on the wiring board and has plural connection electrodes formed on its surface; and a metal layer of fine metal particles aggregated and bonded which is interposed between the electrodes on the wiring board and the connection electrodes of the semiconductor element to connect between the electrodes and the connection electrodes.

A semiconductor device according to an embodiment of the present invention comprises a wiring board provided with wires; a semiconductor element which is mounted on the wiring board and has plural connection electrodes formed on its surface; and a metal layer of fine metal particles aggregated and bonded which is formed on the wires and has portions extended from the wires to directly contact to the surface of the wiring board, wherein the extended portions of the metal layer and the connection electrodes are bonded.

A method of manufacturing a semiconductor device according to an embodiment of the present invention comprises forming an ink film which is formed by dispersing fine metal particles into a solvent, on wires formed on the surface of a wiring board; mounting connection electrodes which are formed on the surface of a semiconductor element, on the ink film; and forming a metal layer, which has fine metal particles aggregated and bonded, by heating the ink film to evaporate the solvent, wherein the metal layer is interposed between the wires and the connection electrodes to bond between the wires and the connection electrodes.

A method of manufacturing a semiconductor device according to an embodiment of the present invention comprises forming an ink film which is formed by dispersing fine metal particles into a solvent, on wires formed on the surface of a wiring board; mounting plural semiconductor elements having connection electrodes on the wiring board to dispose the connection electrodes on the ink film; and heating the ink film to evaporate the solvent to form a metal layer of fine metal particles aggregated and bonded and bonding the wires and the connection electrodes by the metal layer.

DETAILED DESCRIPTION OF THE INVENTION

Embodiments of the present invention will be described with reference to examples. The present invention connects projecting electrodes (bumps) of a semiconductor chip and wires or electrode pads connected to the wires of a wiring board by a metal layer which has fine metal particles aggregated and bonded, and this metal layer is formed by blowing a solution consisting of the fine metal particles and a solvent onto the wiring board by an ink-jet method and removing the solvent.

EXAMPLE 1

Figure 1A:
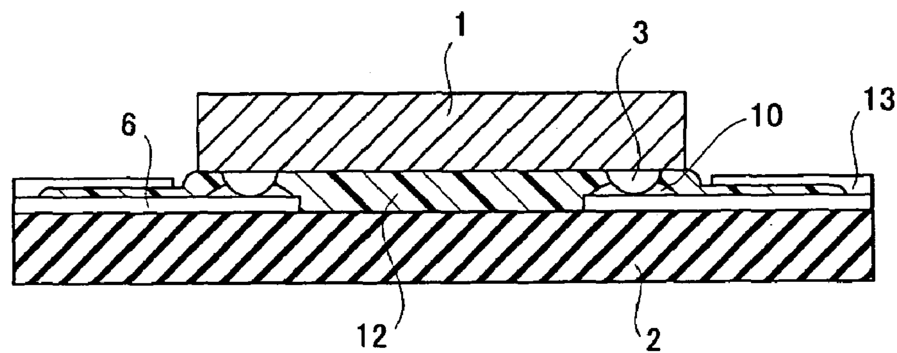
FIG. 1A and FIG. 1B are a schematic sectional view and a plan view of a semiconductor device which has a semiconductor chip mounted on the wiring board according to Example 1 which is an embodiment of the present invention.
Figure 1B:
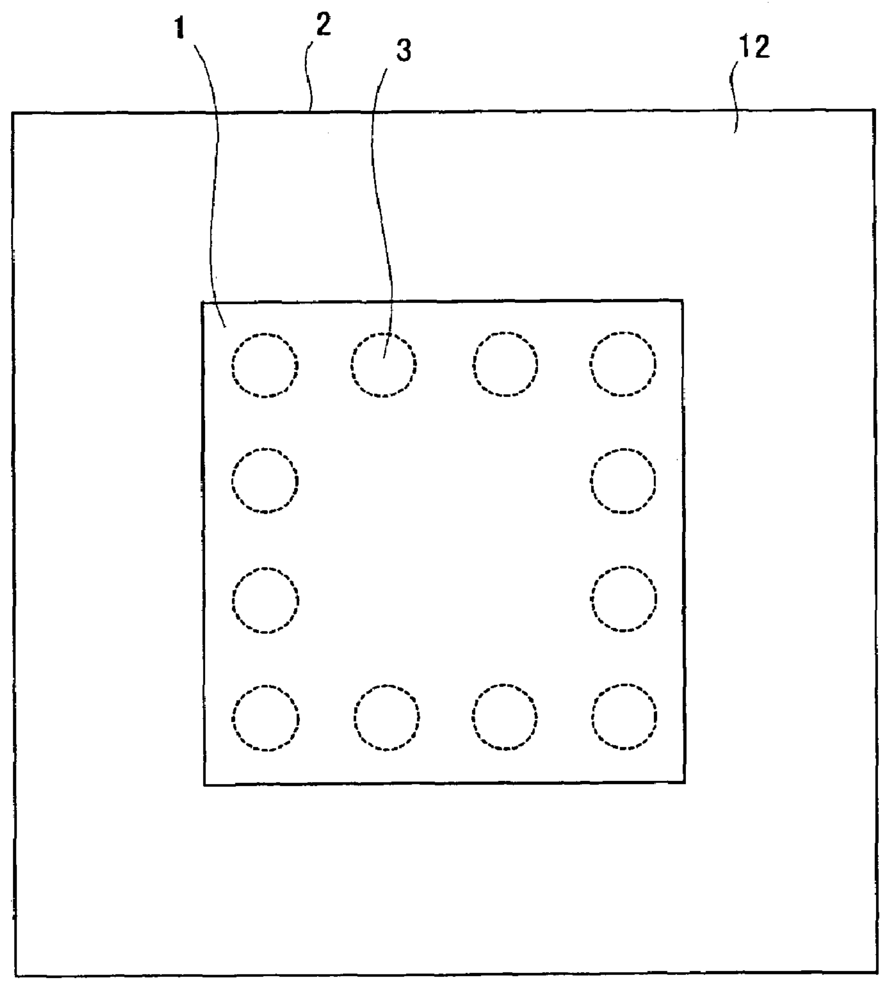
Figure 2:
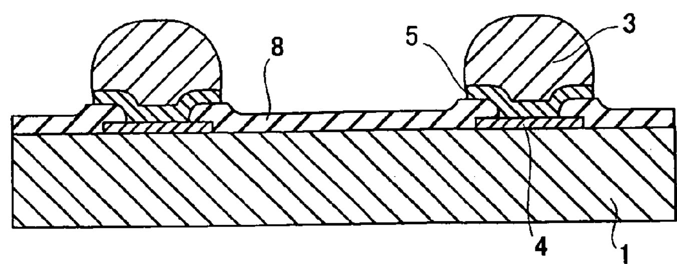
FIG. 2 is a sectional view showing a detail structure of the semiconductor chip shown in FIG. 1A and FIG. 1B.
Figure 3:
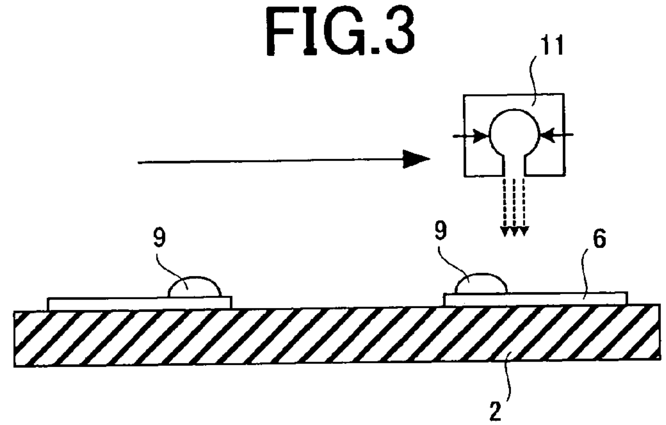
FIG. 3 is a sectional view of a wiring board illustrating a step of forming the metal layer according to Example 1 of the present invention.
Figure 4A:
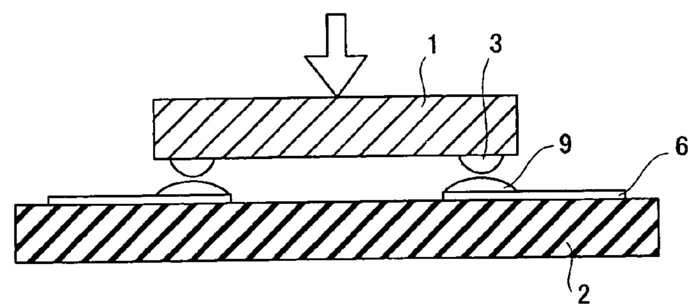
FIG. 4A and FIG. 4B are schematic sectional views illustrating a step of mounting the semiconductor chip of FIG. 1A and FIG. 1B on a wiring board.
Figure 4B:
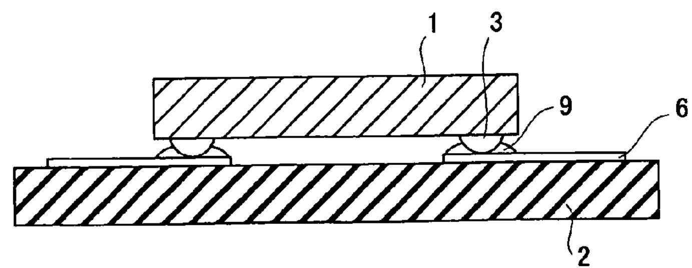
Figure 5A:
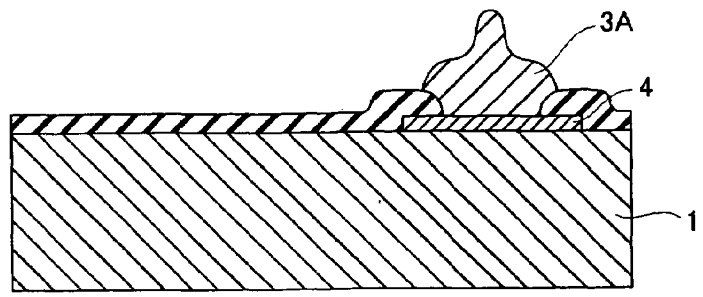
FIG. 5A and FIG. 5B are sectional views of a semiconductor chip using bumps other than those of FIG. 2 according to Example 1 which is an embodiment of the present invention.
Figure 5B:
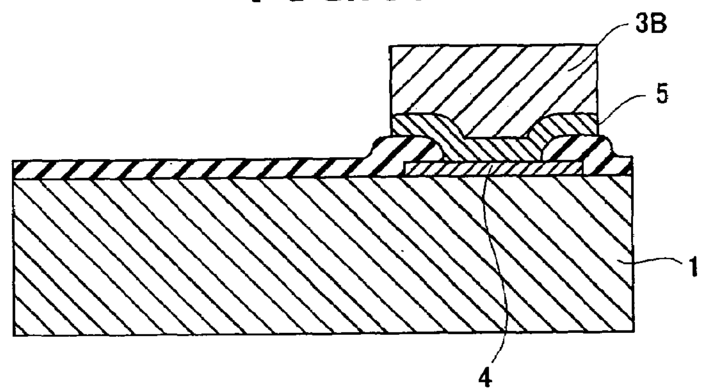

First, Example 1 will be described with reference to FIG. 1A through FIG. 5B. FIG. 1A and FIG. 1B are a schematic sectional view and a plan view of a semiconductor device which has a semiconductor chip mounted on a wiring board, FIG. 2 is a sectional view showing a detail structure of the semiconductor chip shown in FIG. 1A and FIG. 1B, and FIG. 3 is a sectional view of a wiring board illustrating a step of forming a metal layer. FIG. 4A and FIG. 4B are schematic sectional views illustrating a step of mounting the semiconductor chip of FIG. 1A and FIG. 1B on the wiring board. FIG. 5A and FIG. 5B are sectional views of a semiconductor chip using bumps other than those shown in FIG. 2.

FIG. 1A and FIG. 1B show a semiconductor device of this example which has a semiconductor chip (silicon chip) flip-chip connected to a wiring board. As shown in FIG. 2, the main surface of a semiconductor substrate 1 is given a protective insulating film 8 such as a silicon oxide film. On the main surface having the protective insulating film 8 thereon, electrode pads 4 of Al or the like which are exposed from openings of the protective insulating film 8 and electrically connected to the inside integrated circuit, barrier metal layers 5 formed of Ti/Ni, Ti/Ni/Pd, Cr/Cu or the like which are on the electrode pads 4 and extended onto the protective insulating film 8 over the electrode pads 4, and bumps 3 which are formed of solder bumps mainly consisting of Pb, Sn and the like and formed on the barrier metal layers 5, are formed.

As shown in FIG. 3, a wiring board 2 which is formed of a glass epoxy substrate or the like is formed wiring patterns on its main surface, and a protective film 13 such as a solder resist (see FIG. 1A) and electrode pads are formed as required. Ink is blown onto a prescribed position of a wire 6 to form ink film 9 by blowing from an ink-jet head 11 of an ink-jet device. Then, the ink-jet head 11 is moved as indicated by an arrow to form the ink film 9 on the wire 6 of the next position. The ink is prepared by, for example, dispersing fine particles (an average particle diameter of 5 nm to 1 mm, preferably about 5 to 10 nm) of Ag, Au or Ag and Au into a solvent selected from water, methanol, ethanol, propanol and other alcohols. Especially, nanoparticles having an average particle diameter of 5 to 10 nm have aggregation and bonding strength higher than those of fine metal particles having a larger average particle diameter. An appropriate content of the fine metal particles contained in the ink is 10 wt % to 70 wt %. The ink-jet device discharges the ink according to a continuous injection method or an on-demand method, and the ink is blown by an electrostatic actuator or a piezoelectric actuator.

Then, a step of mounting a semiconductor chip on a wiring board will be described with reference to FIG. 4A and FIG. 4B. FIG. 4A and FIG. 4B schematically show a structure of the semiconductor chip with bumps only, and the protective insulating film and the electrode pads are not shown. The semiconductor chip 1 is disposed to oppose its surface having the bumps 3 to the main surface of the wiring board 2 which has the ink film 9 formed on the wires 6 (FIG. 4A). Then, the semiconductor chip 1 is mounted on the wiring board 2 so that the bumps 3 come into contact with the ink film 9 (FIG. 4B). Subsequently, the ink film is heated at a prescribed temperature to evaporate the solvent contained therein to form a metal layer 10 in which fine metal particles are aggregated and bonded on the wires 6. Where the solvent is water, the solvent can be evaporated by heat of 100° C., so that the bumps 3 and the wires 6 are bonded by heating at about 100° C. If necessary, a sealing resin 12 such as underfill or the like can be filled to enhance the reliability of bonding as shown in FIG. 1 after the semiconductor chip is tested. FIG. 1B is a plan view of the semiconductor device of FIG. 1A observed from above with the protective film omitted in order to clarify the shape of the sealing resin and in a partly transparent state to clarify the location of the bumps.

Then, a semiconductor chip using bumps different from solder bumps will be described with reference to FIG. 5A and FIG. 5B. The bumps of the semiconductor chip of silicon or the like used in the present invention include stud bumps, plated bumps and the like. A wire bonder (not shown) is used to fix stud bumps 3A of Au or Cu to the electrode pads 4 of Al or the like which are formed on the main surface of the semiconductor chip 1 by tearing a leading end of an Au wire (FIG. 5A). The barrier metal 5 of Ti/Ni or the like is formed on the electrode pads 4 of Al or the like which are formed on the main surface of the semiconductor chip 1 by a sputter (not shown), and plated bumps 3B of Au or Cu are selectively formed on it by electrolytic plating or the like (FIG. 5B). The individual bumps are also fixed firmly to the metal layer 10 shown in FIG. 1A.

As described above, the solvent contained in the solution used for the ink jet is evaporated to obtain a conduction function, so that the connection can be made easily at a low temperature. In this example, the metal layer having the fine metal particles aggregated and bonded at a low temperature of about 100° C. is formed, so that the breakage of the bonded structure between the semiconductor chip and the wiring board by a stress applied to the bumps because of a difference in thermal expansion coefficient is decreased. And the connection can be made at a lower temperature by evaporating the solvent contained in the solution at the vacuum atmosphere.

EXAMPLE 2

Figure 6A:
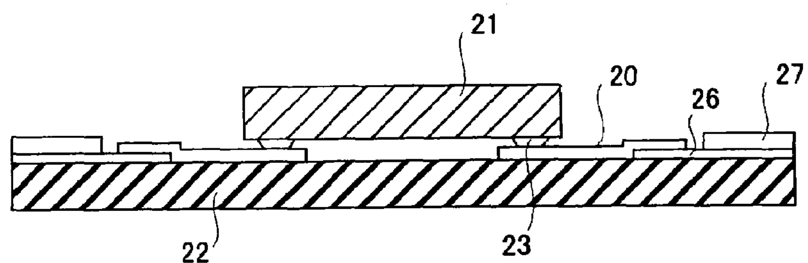
FIG. 6A and FIG. 6B are schematic sectional views of a semiconductor device having a wiring board which has the bumps of a semiconductor chip bonded to a metal layer, which has fine metal particles according to Example 2 as an embodiment of the present invention aggregated and bonded.
Figure 6B:
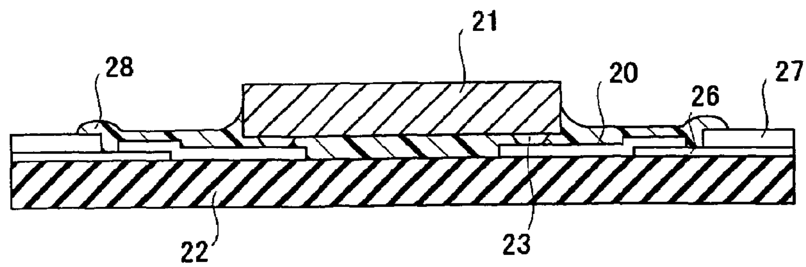

Then, Example 2 will be described with reference to FIG. 6A through FIG. 7C. FIG. 6A and FIG. 6B are schematic sectional views of a semiconductor device having a wiring board which has the bumps of a semiconductor chip bonded to a metal layer which has fine metal particles aggregated and bonded, and FIG. 7A through FIG. 7C are schematic plan views of semiconductor devices illustrating the effects of using the metal layer of FIG. 6A and FIG. 6B.

Figure 7A:
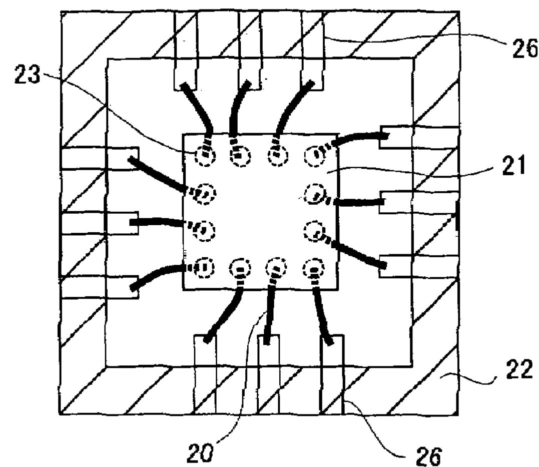
FIG. 7A through FIG. 7C are schematic plan views of a semiconductor device illustrating the effects of using the metal layer of FIG. 6A and FIG. 6B.
Figure 7B:
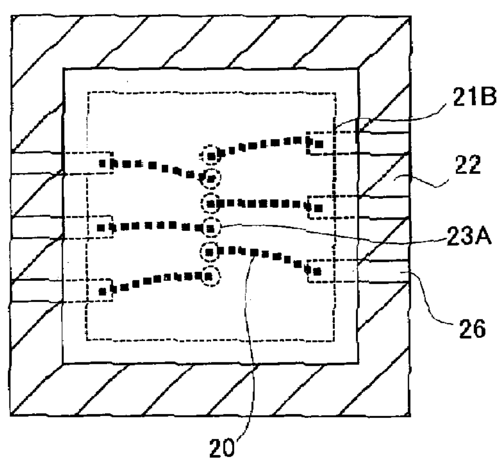
Figure 7C:
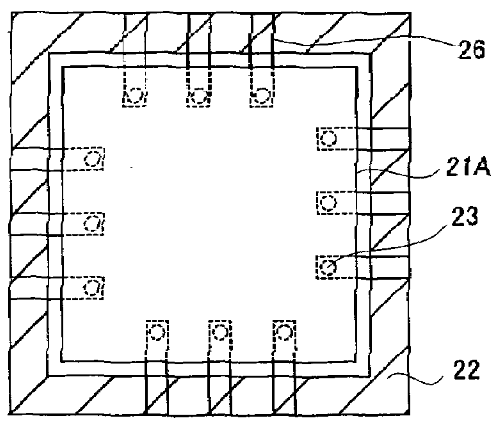

As shown in FIG. 6A and FIG. 7A, wiring-patterns are formed on the main surface of a wiring board 22, and a protective film 27 of a solder resist or the like is formed if necessary. Plural wires 26 configuring the wiring patterns are formed of, for example, Cu or the like and extended from the edges of the individual sides toward the center. A metal layer 20 having fine metal particles of Ag or the like aggregated and bonded is formed to have a width of about 20 to 50 μm. An ink-jet head (not shown) is moved from the ends of the wires 26 toward the center of a semiconductor chip 21 to blow ink onto the main surface to form the ink film having substantially the same width. And, the solvent is removed from the ink film to form the metal layer 20. For example, solder bumps 23 (the bump structure is simplified in this drawing) of the semiconductor chip 21 are mounted on the ink film, and the solvent is removed from the ink film to form the metal layer 20, and the bumps 23 and the wires 26 are bonded.

If necessary, after the semiconductor chip 21 is tested, the metal layer 20 is protected by being coated with a sealing resin 28 such as an underfill resin, an epoxy resin or the like. In other words, the sealing resin 28 is filled in the space between the semiconductor chip 21 and the wiring board 22 as shown in FIG. 6B, and the region on the main surface of the wiring board 22 and not occupied by the semiconductor chip 21 is also coated with the sealing resin 28.

The metal layer which has the fine metal particles aggregated and bonded is used in this example, so that the semiconductor chip 21 which is smaller than a semiconductor chip 21A (see FIG. 7C) having a size appropriate for the wiring board can be mounted. Thus, flexibility of selection of the semiconductor chip with respect to the wiring board is increased. In other words, this metal layer has two roles as wires and a bonded body.

In FIG. 7B, a semiconductor chip 21B having a size matching the wiring board 22 is mounted. This semiconductor chip 21B has the same size as that of the semiconductor chip 21A shown in FIG. 7C, but the bumps 23A are disposed at the center of the chip. Thus, even if the semiconductor chip is changed its electrode arrangement or its size, the semiconductor chip can be connected to the wiring board without changing the wires of the wiring board. In other words, even if the positions of bumps of the semiconductor chip are changed in this example, a remedy can be made adequately by giving the metal layer, which has the metal particles aggregated and bonded, two roles of the wires and the bonded body.

EXAMPLE 3

Figure 8A:
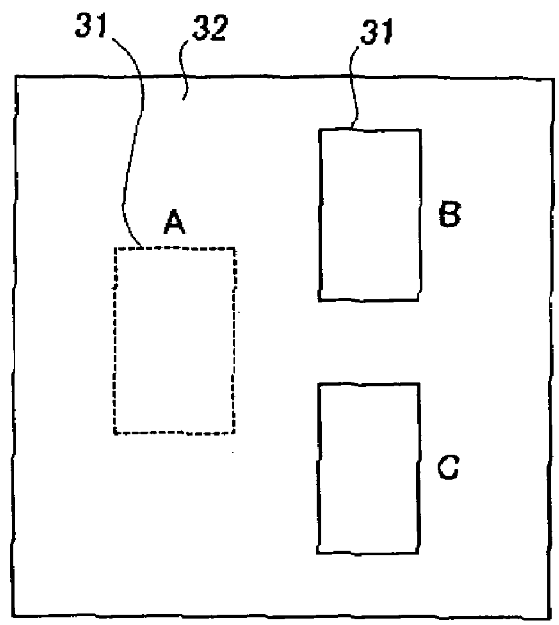
FIG. 8A and FIG. 8B are schematic plan views illustrating a step of changing a semiconductor chip mounted on the wiring board according to Example 3, which is an embodiment of the present invention, to a good-quality product.
Figure 8B:
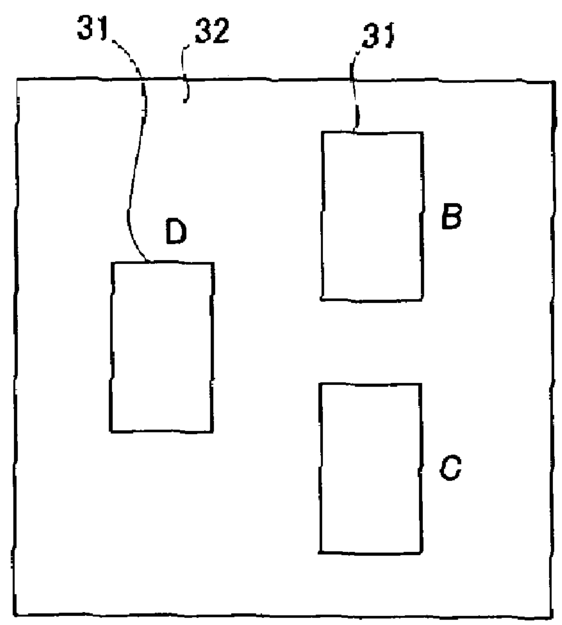
Figure 9A:
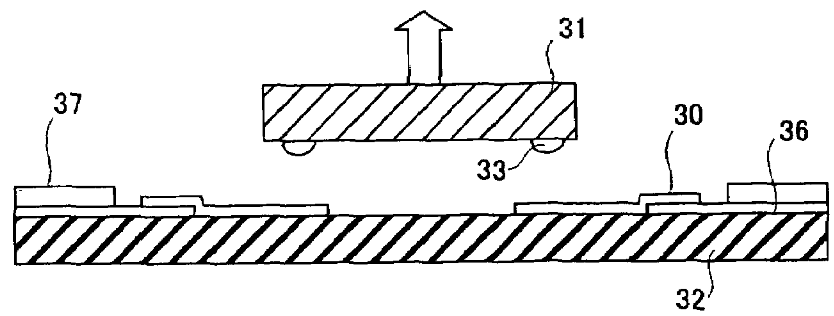
FIG. 9A and FIG. 9B are schematic sectional views illustrating a step of removing a defective part from the wiring board according to Example 3 of the present invention.
Figure 9B:
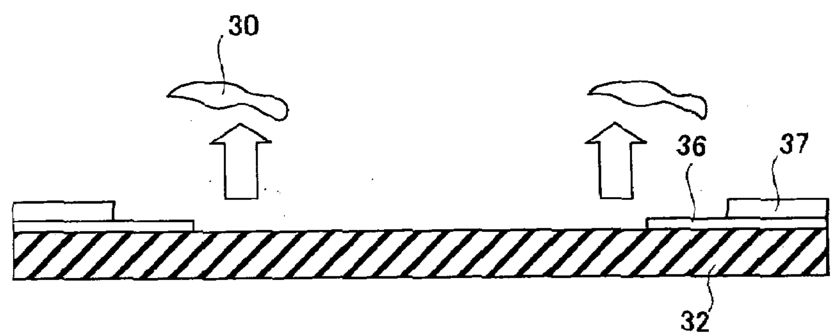

Then, Example 3 will be described with reference to FIG. 8A through FIG. 9B. FIG. 8A and FIG. 8B are schematic plan views illustrating a step of changing a semiconductor chip mounted on the wiring board to a good-quality product, and FIG. 9A and FIG. 9B are schematic sectional views illustrating a step of removing a defective part from the wiring board. FIG. 8A and FIG. 8B show wiring boards with a wiring pattern, a metal layer and a protective film omitted. FIG. 9A and FIG. 9B show semiconductor chips with the structure of bumps simplified.

Semiconductor chips (A, B, C) 31 are mounted on a wiring board 32 (FIG. 8A). Bumps of the semiconductor chips 31 are bonded to prescribed wires of the wiring patterns on the wiring board 32 by a metal layer having fine metal particles aggregated and bonded. The semiconductor chips 31 having been mounted are tested after the burn-in process, respectively. A defective part A was found as the test result. Then, a step of removing the defective part A, which is among the semiconductor chips 31, from the wiring board 32 is conducted.

As shown in FIG. 9A and FIG. 9B, a metal layer 30, which has the fine metal particles aggregated and bonded, has its one end bonded to wires 36 formed on the wiring board 32 and its other end extended toward the center of the position where the defective part A is mounted is formed by an ink-jet method. A protective film 37 of a solder resist or the like is formed on the wires 36 of the wiring board 32, if necessary. Bumps 33 formed of solder bumps of the semiconductor chip 31 are bonded to the other end of the metal layer 30. There is a case where the bumps 33 are easily separated from the metal layer 30 by pulling the semiconductor chip 31 in the direction indicated by the arrow (FIG. 9A). Besides, the metal layer 30 having bonded the defective part A is removed cleanly by applying ultrasonic waves in a liquid such as alcohol (FIG. 9B). The semiconductor chip 31 and the metal layer 30 can be removed collectively, if the ultrasonic waves or the like are applied in the state where the solder bumps are connected. This is because the adhesive force between the metal layer 30 and the wiring board 32 is low since the surface of the wiring board 32 is not specially treated. Then, a metal layer having fine metal particles aggregated and bonded is formed by the same ink-jet method as described above on the wires 36 which are disposed on the area where the defective part A was present, and the semiconductor chip (D) 31 is mounted on the metal layer to bond the bumps to it (FIG. 8B). When it is found by testing that the semiconductor chip (D) 31 mounted on the wiring board 32 is a good-quality product, the surface of the wiring board 32 is coated with an insulating film of a synthetic resin or the like to complete the semiconductor device.

Conventionally, bumps are solder-bonded or ACF-connected to wires with a high bonding strength, so that the wiring board or the wires may be broken when the semiconductor chip is removed. Otherwise, the solder bumps are remained partly on the wires, and it is very hard to control the amount and oxidized state of the remained solder. When the ACF connection is employed, damage remains on the substrate electrode pads depending on a pressurizing force applied at the time of bonding. Therefore, the wiring board having a defective semiconductor chip was generally disposed. When disposed, costs for not only the wiring board but also the semiconductor chips B and C are wasted substantially. But, the bonding strength of the metal layer in this example is lower than that of the solder bonding, and the defective part can be removed without damaging the wiring board and the like, so that the defective part can be changed to a good-quality product as described above to reproduce the wiring board. Therefore, the present invention contributes to resource saving.

The metal layer which also serves as the wiring is used in this example in the same manner as in Example 2, so that even if the good-quality product D has a size different from that of the defective part A, the problem can be dealt with.

EXAMPLE 4

Figure 10:
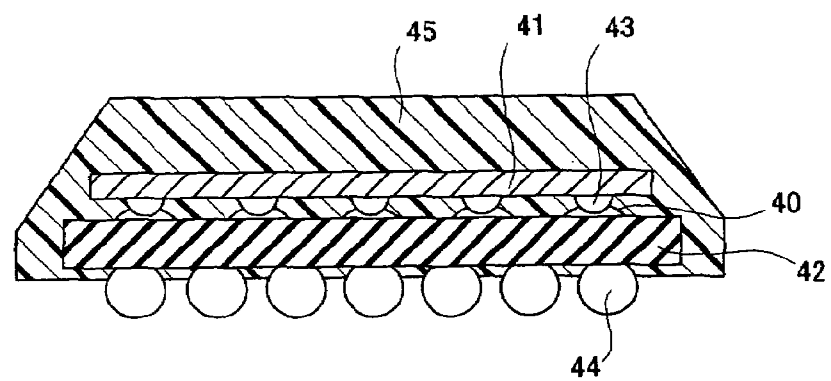
FIG. 10 is a schematic sectional view of a semiconductor device having a wiring board which is provided with ball-shaped external terminals according to Example 4 which is an embodiment of the present invention.
Figure 11A:
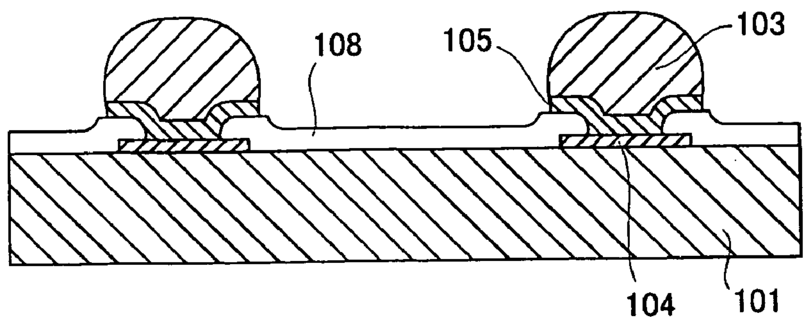
FIG. 11A is a semiconductor chip illustrating a conventional method of connecting a semiconductor chip to a wiring board.
Figure 11B:
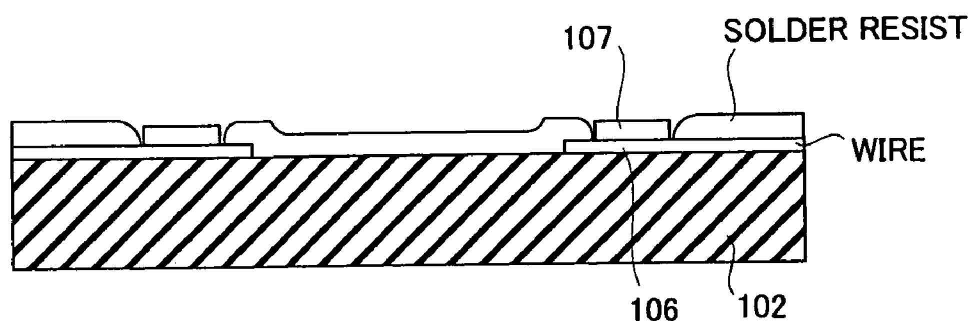
FIG. 11B is a sectional view of a conventional wiring board.
Figure 11C:
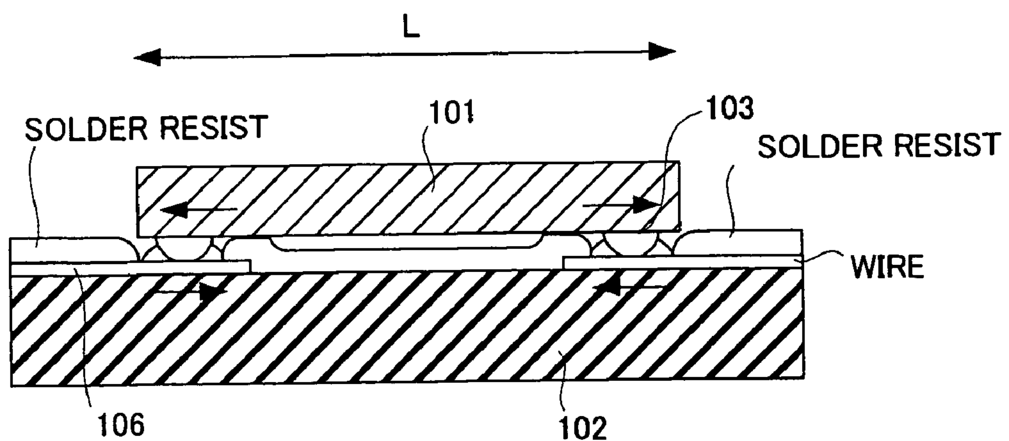
FIG. 11C is a sectional view of a conventional semiconductor device having the semiconductor chip which is flip-chip connected to the wiring board.

Then, Example 4 will be described with reference to FIG. 10. FIG. 10 is a schematic sectional view of a CSP (Chip Size. Package) type semiconductor device having a wiring board provided with ball-shaped external terminals. FIG. 10 shows the wiring board with wiring patterns omitted and a simplified bump structure of the semiconductor chip.

On the main surface of a semiconductor chip 41, a protective insulating film (not shown) such as a silicon oxide film is applied, and electrode pads (not shown) of Al or the like which are exposed from openings in the protective insulating film and electrically connected to the inside integrated circuit, a barrier metal layer (not shown) formed of Ti/Ni, Ti/Ni/Pd or the like which is on the electrode pads and extended onto the protective insulating film over the electrode pads and bumps 43 which are formed of solder mainly consisting of Pb, Sn and the like and formed on the barrier metal layer, are formed. Meanwhile, wiring patterns (not shown) are formed on the main surface of a wiring board 42 which is formed of a glass epoxy substrate. External terminals 44 such as solder balls electrically connected to the wiring patterns of the main surface are attached to the back side of the wiring board 42.

Ink is blown onto prescribed positions on the wiring patterns from the ink-jet head to form an ink film. The ink is prepared by, for example, dispersing fine particles (an average particle diameter of about 5 nm to 1 mm, preferably about 5 to 10 nm) of Ag or Au or Ag and Au into a solvent selected from water and alcohols such as methanol, ethanol, propanol and the like. The ink film is thermally treated at a low temperature of about 100° C. to remove the solvent. Thus, a metal layer 40 which has fine metal particles aggregated and bonded is formed. The metal layer 40 firmly bonds the wires on the wiring board 42 and the bumps 43 of the semiconductor chip 41. The semiconductor chip 41 and the wiring board 42 are coated with a sealing resin 45 such as an epoxy resin. And, only leading ends of the external terminals 44 are exposed from the sealing resin 45.

As described above, the metal layer which has fine metal particles aggregated and bonded at a low temperature of about 100° C. is formed in this example, so that the breakage of the bonded structure between the semiconductor chip and the wiring board by a stress applied to the bumps because of a difference in thermal expansion coefficient, is decreased. And, a warp of the CSP type semiconductor device which is caused because of a difference in a thermal expansion coefficient between Si and the glass epoxy substrate, is decreased. This warp constitutes a problem at the time of mounting the package on the mother board because evenness of the solder balls (external terminals) 44 in the package is inhibited. For example, as specified in JEDEC DESIGN STANDARD, JEDEC PUBLICATION 95 DESIGN GUIDE 4.5 "Fine-pitch, Squar Ball Grid Array Package (FBGA)", if the solder balls have a pitch of 0.5 mm, evenness of 0.12 mm is required, and the package size becomes larger every year, and the ball pitch has a tendency to become small. Therefore, the connection at a low temperature according to the present invention has a great value.

The best modes for conducting the present invention have been described above, and the following structure is also included in the present invention. The wiring board used for the semiconductor device of the present invention may be formed to have plural semiconductor elements on it. The wiring board may be formed to have connection terminals which are electrically connected to the wires formed on the surface and electrically connected to an outside circuit. Fine particles configuring the metal layer used for the semiconductor device of the present invention may contain at least one of Ag, Cu, Au, Pd and Pt. The fine particles may have an average particle diameter of 5 nm to 1 mm. The metal layer may be coated with a sealing resin. According to the method for manufacturing the semiconductor device of the present invention, the step of forming the ink film can employ a method of forming by blowing ink onto the wires formed on the wiring board by the ink-jet device or a method of forming by blowing ink by the ink-jet device so to have portions, which extend so as to directly contact, on the surface of the wiring board. As a method of evaporating the solvent, evaporation may be made in a vacuum or heating may be performed in a vacuum in order to evaporate at a low temperature.

The present invention is applied to a semiconductor device of a type which has the projecting electrodes (bumps) formed on the semiconductor chip electrically connected to the wiring patterns of the wiring board and can be adapted to various usage such as a memory, a logic or discrete semiconductor or a circuit of their combination, and the like.

What is claimed is:

1. A method of manufacturing a semiconductor device, comprising:

forming an ink film, which is prepared by dispersing fine metal particles into a solvent, on wiring patterns formed on the surface of a wiring board;

mounting connection electrodes, which are formed on the surface of a semiconductor element, on the ink film formed on the wiring patterns; and forming a metal layer, which has fine metal particles aggregated and bonded, by heating the ink film to evaporate the solvent, wherein the metal layer is interposed between the wires and the connection electrodes to bond between the wires and the connection electrodes.

2. A method of manufacturing a semiconductor device, comprising:

forming an ink film which is formed by dispersing fine metal particles into a solvent, on wires formed on the surface of a wiring board;

mounting plural semiconductor elements having connection electrodes on the wiring board to dispose the connection electrodes on the ink film; and heating the ink film to evaporate the solvent to form a metal layer of fine metal particles aggregated and bonded and bonding the wires and the connection electrodes by the metal layer.

3. A method of manufacturing a semiconductor device according to claim 2, further comprising:

testing the plural semiconductor elements, removing a defective part from the wiring board, then removing the metal layer which bonds the connection electrode of the defective part and the wires;

forming another ink film on the removed region; and mounting a new semiconductor element on the region of the wiring board where the defective part was removed, and bonding the wires and the connection electrodes of the new semiconductor element by a metal layer of fine metal particles which are newly formed on the region, aggregated and bonded.

* * * * *